United States Patent
Lundin et al.

(10) Patent No.: US 12,180,579 B2
(45) Date of Patent: Dec. 31, 2024

(54) METHOD FOR MONITORING PROCESS CONDITIONS OF, AND METHOD FOR CONTROLLING, A PLASMA PVD PROCESS

(71) Applicant: IONAUTICS AB, Öjebyn (SE)

(72) Inventors: Daniel Lundin, Linköping (SE); Ulf Helmersson, Brokind (SE)

(73) Assignee: IONAUTICS AB, Öjebyn (SE)

( * ) Notice: Subject to any disclaimer, the term of this patent is extended or adjusted under 35 U.S.C. 154(b) by 92 days.

(21) Appl. No.: 17/913,353

(22) PCT Filed: Mar. 29, 2021

(86) PCT No.: PCT/SE2021/050282
§ 371 (c)(1),
(2) Date: Sep. 21, 2022

(87) PCT Pub. No.: WO2021/206609
PCT Pub. Date: Oct. 14, 2021

(65) Prior Publication Data
US 2023/0151476 A1 May 18, 2023

(30) Foreign Application Priority Data
Apr. 6, 2020 (SE) .................................... 2030116-4

(51) Int. Cl.
*C23C 14/35* (2006.01)
*C23C 14/52* (2006.01)
*C23C 14/54* (2006.01)

(52) U.S. Cl.
CPC ............ *C23C 14/35* (2013.01); *C23C 14/52* (2013.01); *C23C 14/543* (2013.01)

(58) Field of Classification Search
CPC ....... C23C 14/35; C23C 14/52; C23C 14/543; C23C 14/345; C23C 14/54; C23C 14/24;
(Continued)

(56) References Cited

U.S. PATENT DOCUMENTS 5,474,648 A   12/1995  Patrick et al.
7,019,543 B2   3/2006  Quon
(Continued)

FOREIGN PATENT DOCUMENTS

JP   H11-158629 A    6/1999
JP   2004-534351 A   11/2004
(Continued)

OTHER PUBLICATIONS

International Search Report and Written Opinion dated Jun. 25, 2021, issued in corresponding International Patent Application No. PCT/SE2021/050282.
International Preliminary Report on Patentability dated Dec. 15, 2021, issued in corresponding International Patent Application No. PCT/SE2021/050282.
(Continued)

*Primary Examiner* — Rodney G McDonald
(74) *Attorney, Agent, or Firm* — Morgan, Lewis & Bockius LLP

(57) ABSTRACT

A method (200) for monitoring process conditions in a plasma PVD process as well as a method (300) for controlling a plasma PVD process are disclosed. The methods are performed in an apparatus (1) configured therefore. In accordance with the methods, an oscillating voltage signal is applied to a target (3), arranged in the apparatus (1), by means of a radio frequency generator 15). The response from the applied oscillating voltage signal is recorded by means of a radio frequency sensor (16). Based on the recorded response, information regarding at least one plasma process condition is derived. A computer program and a computer-readable medium are also disclosed.

20 Claims, 4 Drawing Sheets

(58) Field of Classification Search
CPC ....... C23C 14/00; H01J 37/3467; H05H 1/00; H05H 1/0006; H05H 1/01; H05H 1/4645; H01L 21/02
USPC .......................... 204/192.13, 298.03, 298.06
See application file for complete search history.

(56) References Cited

U.S. PATENT DOCUMENTS

| | | | |
|---|---|---|---|
| 7,095,179 B2 * | 8/2006 | Chistyakov | H01J 37/3408 204/192.12 |
| 7,848,898 B2 | 12/2010 | Shannon et al. | |
| 8,933,629 B2 | 1/2015 | Heil et al. | |
| 9,695,503 B2 | 7/2017 | Stowell et al. | |
| 2002/0114123 A1 | 8/2002 | Nishio et al. | |
| 2002/0124959 A1 | 9/2002 | Denda et al. | |
| 2004/0026235 A1 * | 2/2004 | Stowell, Jr. | H01J 37/3405 204/192.12 |
| 2004/0121603 A1 | 6/2004 | Chiu et al. | |
| 2009/0045046 A1 * | 2/2009 | Pipitone | C23C 14/54 204/192.13 |
| 2009/0068769 A1 | 3/2009 | Okumura et al. | |
| 2014/0103808 A1 | 4/2014 | Heil et al. | |
| 2017/0062190 A1 | 3/2017 | Lee et al. | |
| 2019/0368030 A1 | 12/2019 | Chistyakov | |

FOREIGN PATENT DOCUMENTS

| | | |
|---|---|---|
| JP | 2007-335875 A | 12/2007 |
| JP | 2017-534750 A | 11/2017 |
| WO | 2011/143331 A1 | 11/2011 |

OTHER PUBLICATIONS

Search Report dated Nov. 4, 2020, issued in corresponding Swedish Patent Application No. 2030116-4.
Keraudy et al., "Bipolar HiPIMS for tailoring ion energies in thin film deposition", Surface & Coatings Technology 359 (2019) 433-437.
Lundin et al., "Time-resolved ion flux and impedance measurements for process characterization in reactive high-power impulse magnetron sputtering", Journal of Vacuum Science & Technology, vol. A 34, 041305 (2016).
Sezemsky et al., "Modified high frequency probe approach for diagnostics of highly reactive plasma", Plasma Sources Science and Technology, 28 (2019) 115009.
Sobolewski, "Electrical characterization of radio-frequency discharges in the Gaseous Electronics Conference Reference Cell", Journal of Vacuum Science & Technology, vol. A 10, 3550 (1992).
Viloan et al., "Bipolar high power impulse magnetron sputtering for energetic ion bombardment during TiN thin film growth without the use of a substrate bias", Thin Solid Films 688 (2019) 137350.
Müller et al., "Towards Fast Measurement of the Electron Temperature in the SOL of ASDEX Upgrade Using Swept Langmuir Probes", Contrib. Plasma Phys. 50, No. 9, 847-853 (2010).
Čada et al., "Time-resolved plasma parameters in the HiPIMS discharge with Ti target in Ar/O2 atmosphere", Surface & Coatings Technology 205 (2011) S317-S321.
Office Action dated May 17, 2023, issued in corresponding European Patent Application No. 21716868.1.
Office Action dated Feb. 5, 2024 issued in corresponding Japanese Patent Application No. 2022-559997.

* cited by examiner

METHOD FOR MONITORING PROCESS CONDITIONS OF, AND METHOD FOR CONTROLLING, A PLASMA PVD PROCESS

TECHNICAL FIELD

The present disclosure relates in general to a method for monitoring process conditions in a plasma PVD process. The present disclosure further relates in general to a method for controlling a plasma PVD process. The present disclosure further relates in general to a computer program and a computer-readable medium. The present disclosure also relates in general to a plasma PVD process apparatus.

BACKGROUND

Physical vapor deposition (PVD) is a generic term for a variety of different processes which may be used for production of thin films, coatings or nanoparticles. According to these processes, a source material goes from a solid phase (or in some rare cases, a liquid state) to a vapor phase and then again to a solid state, for example as a thin film on a substrate. The most common PVD processes include sputtering, wherein atoms or particles are physically ejected from the source material, and evaporation, wherein the source material is evaporated to the vapor phase.

With the introduction of various ionized physical vapor deposition (IPVD) processes, the possibility to ionize and accelerate a substantial fraction of the deposition flux has opened up new ways to tailor thin films with improved properties. One example of an IPVD method currently gaining a lot of interest is high-power impulse magnetron sputtering (HiPIMS). HiPIMS utilizes very high power densities of the order of $kW/cm^2$, averaged over the active cathode surface, in short pulses at a low duty cycle, usually <10%. By means of HiPIMS, it is inter alia possible to obtain a very high degree of ionization of the sputtered source material.

Many PVD processes suffer from the problem of the process parameters not being stable, both in the short-time frame (seconds) and in the long-time frame (minutes and hours). For the purpose of providing a more stable process, it would be desirous to be able to continuously, or regularly, determine the process parameters and based on the data, shift and guide the input parameters of the PVD process. However, commonly known measurement methods for determining certain process parameters defining plasma characteristics are complex and some are even likely to disturb the process. The latter can in turn be very costly in a production environment, for example if resulting in a whole batch having an inferior quality of the resulting film or nanoparticles.

A previously known technique to analyze sputtering plasma conditions is to utilize a probe connected to a radio frequency bias voltage source and perform precise probe RF voltage and RF current waveform measurements. A proper analysis of the measured signals allows determining ion flux to the probe surface. The method was originally proposed by Sobolewski in the 1990s (see M. A. Sobolewski, J. Vac. Sci. Technol. A 10, 3550 (1992)).

D. Lundin et al., Time-resolved ion flux and impedance measurements for process characterization in reactive high-power impulse magnetron sputtering, Journal of Vacuum Science & Technology A34, 041305 (2016), discloses a planar ion flux probe, based on the so called Sobolewski method for time-resolved plasma characterization. The probe was evaluated in a high-power impulse magnetron sputtering (HiPIMS) process. The probe was placed at the substrate position and time-resolved measurements of the absolute ion flux impinging on the probe, as well as the probe sheath impedance, were recorded during the HiPIMS pulse.

SUMMARY

The object of the present invention is to further improve the ability to determine process conditions in a plasma PVD process while at the same time seek to avoid the risk of disturbing the plasma PVD process.

The object is achieved by means of the subject-matter of the appended independent claims.

In accordance with the present disclosure, a method for monitoring process conditions in a plasma PVD, performed in an apparatus, is provided. The apparatus comprises a process chamber, a target arranged inside the process chamber, and a power supply arrangement connected to the target and configured to generate plasma discharges. The apparatus further comprises a radio frequency generator and a radio frequency sensor. The method comprises a step of, when a plasma has been generated by means of the power supply arrangement, applying an oscillating voltage signal to the target by means of the radio frequency generator. The method further comprises a step of recording a response from the applied oscillating voltage signal by means of the radio frequency sensor. The method further comprises a step of, based on the recorded response, deriving information regarding at least one plasma process condition at or in the close vicinity of the target.

By means of the present method, the target will in addition to acting as a plasma generating electrode also act as a probe used for determining plasma process conditions. Thereby, no additional hardware needs to be inserted into the process chamber. Thereby, the present method may be performed essentially without disturbing the plasma PVD process, which in turn minimizes the risk of loss of production speed or reduced quality of the produced thin film or nanoparticles.

Furthermore, by means of the present method, reliable information regarding the plasma characteristics at the target can be obtained. This inter alio enables an improved possibility for active control of the plasma PVD process in situ, which in turn enables obtaining a more stable plasma PVD process. Moreover, the information regarding the plasma characteristics improves the traceability of the process conditions.

The step of recording a response from the applied oscillating voltage signal may comprise recording the response current amplitude and current phase shift. By knowing the current amplitude and the current phase shift, it is possible to obtain information regarding ion flux to the target surface as well as plasma sheath impedance at the target. Furthermore, information regarding the electron density and the electron temperature at the target can be derived.

The oscillating voltage signal may suitably be applied with a frequency of from 100 kHz to 1 MHz.

Thereby, it is ensured that the frequency is much lower than the ion plasma frequency. At the same time, such a frequency enables a very good time resolution.

The peak-to-peak amplitude of the applied oscillating voltage signal may suitably be from 10 V to 300 V. Thereby, the amplitude is sufficiently high for the electron contribution to the recorded response to be negligible, but at the same time sufficiently low so as to not cause alterations to the plasma PVD process.

The power supply arrangement may be configured to operate in a pulsed mode. In such a case, the step of deriving information regarding at least one plasma process condition may suitably be performed based on a response recorded in between two active plasma discharge pulses as applied by the power supply arrangement. Thereby, it can be avoided having to isolate the recorded response from the power supplied by the power supply arrangement during an active discharge. This in turn significantly facilitates the method. Although there is no active plasma discharge pulse when the response is recorded, there will still be a remnant plasma in the apparatus. Since the present method has a very good time resolution, the time delay from the active plasma discharge to the time at which the response is recorded may be sufficiently short for the fading out of the plasma to be negligible.

According to one aspect, the plasma PVD process may be high-power impulse magnetron sputtering.

Moreover, the method may further comprise, during operation of the plasma PVD process, applying a second oscillating voltage signal to a probe arranged at a substrate position, recording the response from the second applied oscillating voltage signal. The method may further comprise, based on the recorded response from the second applied oscillating voltage, deriving information regarding at least one plasma process condition at the substrate position. Thereby, further information regarding the processing conditions during the plasma PVD process can be obtained, more specifically at the substrate position. This in turn further improves the traceability of the process conditions as well as further enables improved active control of the plasma PVD process in situ for the purpose of obtaining a more stable process and/or to achieve desired thin film or nanoparticle properties.

The present disclosure further provides a method for controlling a plasma PVD process, for example a high-power impulse magnetron sputtering process, performed in an apparatus. The apparatus comprises a process chamber, a target arranged inside the process chamber, and a power supply arrangement connected to the target and configured to generate plasma discharges. The apparatus further comprises a radio frequency generator and a radio frequency sensor. The method for controlling a plasma PVD process comprises a step of performing the method for monitoring process conditions in a plasma PVD process as described above, thereby deriving information regarding at least one plasma process condition. The method for controlling a plasma PVD process further comprises a step of, based on the derived information regarding at least one plasma process condition at or in the close vicinity of the target, adjusting an input signal to the power supply arrangement for the purpose of adjusting plasma process conditions in the apparatus. Alternatively, or additionally, the method for controlling a plasma PVD process comprises a step of, based on the derived information regarding at least one plasma process condition at or in the close vicinity of the target, adjusting an input signal to a gas supply device configured to introduce process gas into the process chamber, for the purpose of adjusting plasma process conditions in the apparatus.

The method for controlling the plasma PVD process may be performed continuously during the plasma PVD process. Thereby, a more stable plasma PVD process may be achieved.

The present disclosure further relates to a computer program, wherein said computer program comprises instructions for causing a control device to perform any one of the methods described above.

The present disclosure further relates to a computer-readable medium comprising instructions, which when executed by a control device, cause the control device to perform any one of the methods as described above.

Moreover, in accordance with the present disclosure, a plasma PVD process apparatus is provided. The plasma PVD process apparatus comprises:

a process chamber configured to comprise a target;

a power supply arrangement configured to be connected to the target and configured to provide plasma discharges;

a radio frequency generator configured to apply an oscillating voltage to the target when a plasma has been generated by means of the power supply arrangement;

a radio frequency sensor configured to record a response from the applied oscillating voltage signal to the target; and a control device configured to derive information regarding at least one plasma process condition at, or in the close vicinity of, the target based on the response recorded by the radio frequency sensor.

The plasma PVD apparatus has the advantages described above with reference to the corresponding methods.

The power supply arrangement may be configured to be operated in a pulsed mode. In such a case, the control device may be configured to derive information regarding the at least one plasma process condition based on the response recorded by the radio frequency sensor between plasma discharge pulses applied by the power supply arrangement.

The control device may further be configured to adjust an input signal to the power supply arrangement, and/or an input signal to a gas supply device configured to introduce process gas into the process chamber, based on the derived information regarding at least one plasma process condition at or in the close vicinity of the target. The purpose of such an adjustment is to adjust the process conditions in situ.

The plasma PVD process apparatus may for example be a high-power impulse magnetron sputtering apparatus.

BRIEF DESCRIPTION OF DRAWINGS

FIG. 5b shows the corresponding target current characteristics when superimposing an oscillating voltage signal in the HiPIMS process as shown in FIG. 5a;

DETAILED DESCRIPTION

Figure 1:
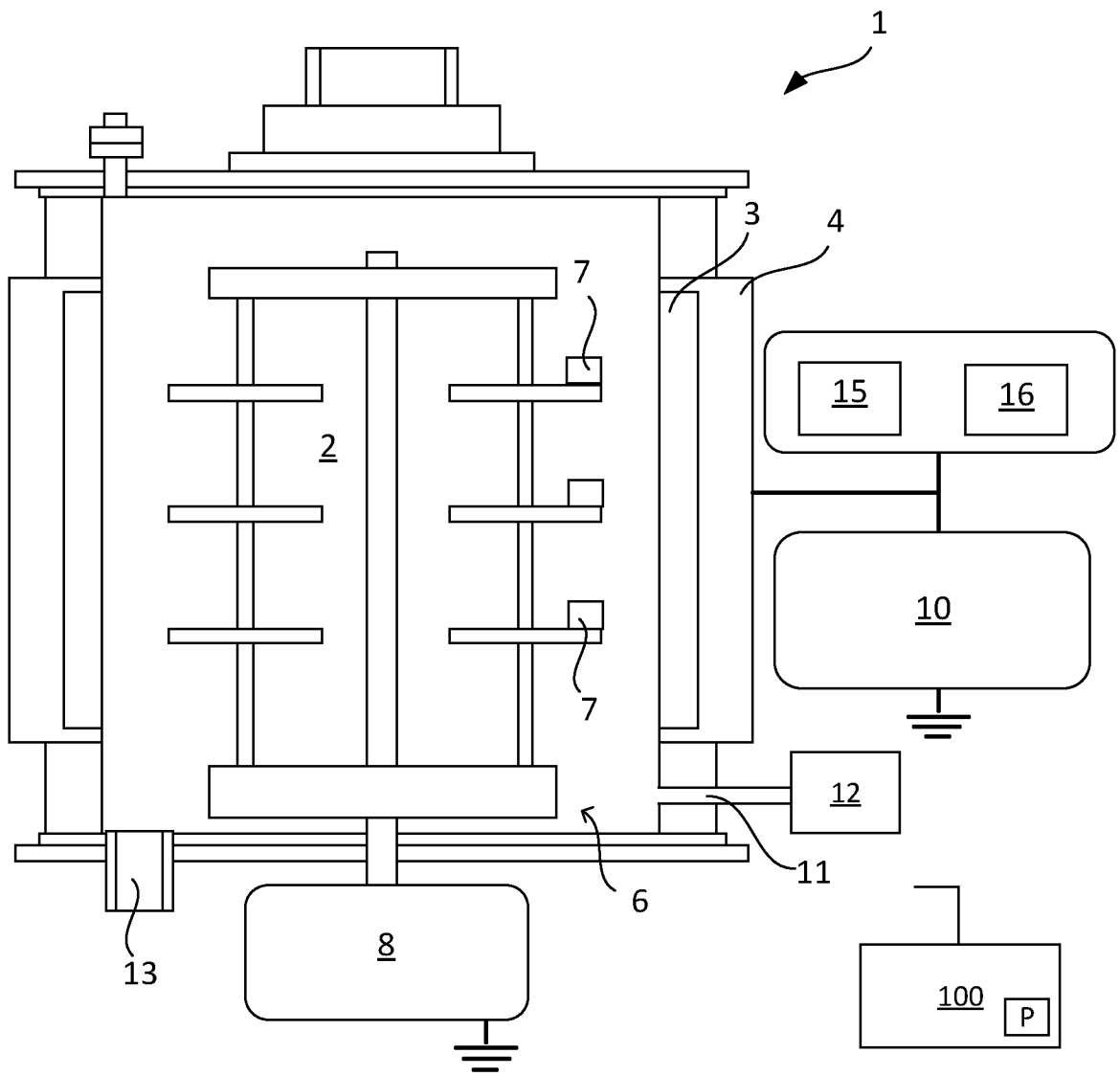
FIG. 1 schematically illustrates a cross sectional view of one exemplifying embodiment of a plasma PVD apparatus in accordance with the present disclosure.

The present invention will in the following be described in more detail with reference to various exemplifying embodiments and the drawings, as well as experimental results. The invention is however not limited to the exemplifying embodiments or experimental results described but may be varied within the scope of the independent claim(s). Furthermore, the drawings shall not be considered drawn to scale as some feature may be exaggerated in order to more clearly illustrate features therein.

In the present disclosure, the term "target" should be interpreted broadly and thus encompasses any plasma generating electrode in a physical vapor deposition process. In a deposition process, the target may be formed of the source material which is to be sputtered (or possibly evaporated) from the surface of the target.

In accordance with the present disclosure, a method for monitoring process conditions in a plasma physical vapor deposition (PVD) process is provided. The method provides real-time process characterization in for example deposition systems used for volume production, without the need to introduce any additional equipment inside the process chamber. Thus, the method according to the present disclosure avoids the need of introducing a separate probe into the process chamber, although this may also be performed to derive further information if desired.

Furthermore, by means of the present method, information regarding the process conditions at the target surface or in the close vicinity thereof may be obtained in real time. This information is highly relevant since it inter alia governs the ionization degree of the sputtered material from the target, which in turn governs the possible degree of ionization of the material flux arriving at the substrate and thus enables tailoring of film texture and microstructure. The method can also provide information on the chemical state of the source material, which enables process stabilization and higher deposition rates when using reactive working gases. Process conditions in the volume close to the target surface may otherwise be very difficult to reliably measure in real time, especially in industrial deposition systems.

The method for monitoring process conditions in a plasma PVD process according to the present disclosure further has the advantage of being able to use in comparatively dirty industrial plasma PVD processes since the data acquisition is not adversely affected by erosion or contamination of the target used to collect the required information. For essentially the same reason, the present method may be used in reactive processes in which a reactive gas is introduced during the process for the purpose of for example producing compound coatings on a substrate.

The method for monitoring process conditions in a plasma PVD process according to the present disclosure is performed in an apparatus comprising a process chamber (such as a vacuum chamber), a target arranged inside the process chamber, a power supply arrangement connected to the target and configured to generate plasma discharges inside the process chamber. The apparatus may be any previously known apparatus for performing the plasma PVD process and typically comprises at least a process chamber and a power supply arrangement configured to generate plasma discharges inside the process chamber. The power supply arrangement may for example be a HiPIMS power supply arrangement, a RF power supply arrangement, a (pulsed or un-pulsed) DC power supply arrangement, or a microwave power supply arrangement. During the plasma PVD process, a target is arranged inside the apparatus. In contrast to such previously known apparatuses, the apparatus wherein the present method is performed is supplemented with a radio frequency generator and a radio frequency sensor. The radio frequency generator is a separate device from the power supply arrangement. In other words, said radio frequency generator is not used for generating, or sustaining, a plasma. Instead, the radio frequency generator is configured to apply an (auxiliary) oscillating voltage signal to the target which is separate from the power supplied by the power supply arrangement for the purpose of generating and/or sustaining a plasma discharge. The radio frequency sensor may suitably be connected to the radio frequency generator so as to also being able to record the applied oscillating voltage signal in addition to the response from the applied oscillating voltage. The method for monitoring process conditions in a plasma PVD process is performed by a control device configured therefore.

The method comprises a step of, when a plasma has been generated by means of the power supply arrangement, applying an oscillating voltage signal to the target by means of the radio frequency generator. The oscillating voltage signal may for example be applied continuously to the target during the operation of the plasma PVD process, or at preselected time intervals. The oscillating voltage may for example be applied with a frequency of between 100 kHz and 1 MHz (including the end values of the range), preferably from 250 kHz to 500 kHz. Such a frequency will give a time resolution in the order of a few microseconds and will therefore for example enable obtaining relevant information regarding the plasma process conditions even when there is no active plasma discharge applied by the power supply arrangement (but a remnant plasma from a previous plasma discharge). The peak-to-peak amplitude of the applied oscillating voltage may suitably be between 10V and 300 V (including the end values), preferably from 40 V to 100 V. Thereby, it is inter alia ensured that the applied oscillating voltage is sufficiently high for the electron contribution to the recorded response to be negligible. Furthermore, it is ensured that the applied oscillating voltage is sufficiently low so as to not cause substantial negative effects to the plasma PVD process as such. The applied oscillating voltage signal may be a sinusoidal shaped voltage signal. Moreover, the oscillating voltage potential applied by the radio frequency generator is not sufficient to generate or sustain a plasma discharge. The maximum power generated by the application of the oscillating voltage signal to the target by means of the radio frequency generator may typically be less than 10%, or even less than 5%, of the time-averaged power supplied to the target by means of the power supply arrangement. According to an example, the maximum power generated by the application of the oscillating voltage signal to the target by means of the radio frequency generator may be equal to or less than 2%, of the time-averaged power supplied to the target by means of the power supply arrangement.

The method further comprises a step of recording the response from the applied oscillating voltage signal by means of the radio frequency sensor. More specifically, the method comprises a step of recording the response of the plasma from the applied oscillating voltage signal. The radio frequency sensor is for said purpose connected to the target. The step of recording a response of the plasma from the applied oscillating voltage signal may comprise recording the response current amplitude. By knowing the response current amplitude and the amplitude of the applied oscillating voltage, it is possible to derive information regarding ion flux to the target surface. The step of recording a response from the applied oscillating voltage signal may also comprise recording the current phase shift, i.e. the relative phase between the oscillating voltage signal and the current response. More specifically, the step of recording a response from the applied oscillating voltage signal may comprise recording the current and voltage waveforms, as well as the current and voltage amplitudes. For the purpose of knowing the amplitude and/or the waveform of the oscillating voltage signal as applied by the radio frequency generator, the radio frequency sensor may preferably be configured to record said applied oscillating voltage signal. This in turn increases the reliability since it can be ensured that the time at which the applied oscillating voltage is accurate in relation to the recorded response, and there is essentially no risk for errors which may occur if relying on input parameters to the radio frequency generator. It should however be noted that measurements of radio frequency signals should be adequately calibrated. The skilled person is however aware of techniques therefore and this will therefore not be described in detail here.

The method further comprises a step of, based on the recorded response, deriving information regarding at least one plasma process condition at or in the close vicinity of the target. The information may for example be derived by calculation of the plasma process condition from the recorded response. In such a calculation, the displacement currents may be subtracted from the recorded response.

Examples of plasma process conditions which may be derived by means of the method for monitoring process conditions in accordance with the present disclosure includes the ion flux to the target surface, the plasma sheath impedance at the target, the electron temperature in the close vicinity of the target as well as electron density in the vicinity of the target. From these process conditions, further information may be obtained. For example, the chemical state of the source material (i.e. the target material) can be obtained by determining the plasma sheath impedance at the target. Furthermore, the ion fraction of the sputtered material can be obtained from the electron density and electron temperature at the target.

By means of the present method, the target will in practice function as a probe in addition to its function as a plasma generating electrode.

The method described above may be performed continuously during the plasma PVD process, or at preselected time intervals as desired. Furthermore, the method described above may also be performed during a temporary interruption of the plasma PVD process. Such a temporary interruption may be performed for the sole basis of enabling performing the method for monitoring according to the present disclosure. Performing the method during a temporary interruption is useful for example in case of plasma PVD processes where the plasma discharges are not provided in a pulsed mode. For other situations, it is generally more relevant to perform the method continuously or at preselected time intervals. In case of performing the method during a temporary interruption, the step of recording a response from the applied oscillating voltage signal should be performed as soon as possible after the interruption of the plasma PVD process in order for the plasma to still be present and for obtaining the most relevant information. This would preferably be in the order of a few microseconds after interruption of the plasma discharge.

The information derived regarding process conditions, resulting from the above described method for monitoring process conditions can be further utilized for various purposes. For example, the derived data may be used for the purpose of traceability of obtained plasma conditions. Moreover, the derived data may be used for the purpose of improving the repeatability of intended process conditions. This can be done by using the derived information for the purpose of controlling the plasma PVD process as will be further described below. Furthermore, the derived data allows for a wider process parameter space available for the development and production of thin films and coatings for different applications. This is due to enabling more stable process conditions for the PVD process by improving the ability to active control the plasma PVD process in situ. Furthermore, the method may advantageously be used also in reactive deposition systems since the ability to in situ monitor the process conditions may improve the active control of the reactive PVD process when operating under unstable conditions. This may in turn improve the quality of the deposited compound film.

The method for monitoring process conditions in a plasma PVD process may in practice be performed in any plasma PVD process as long as the response from the applied oscillating voltage can be identified and isolated from the noise. Here it should be recognized that the oscillating voltage potential applied by the radio frequency generator is of a considerably lower power than the power applied to create plasma discharges. Examples of plasma PVD processes wherein the present method may be utilized include for example DC magnetron sputtering and cathodic arc deposition (which is an evaporation process), but are not limited thereto. The method is however greatly facilitated in case of being performed in pulsed plasma PVD processes, wherein the plasma discharges are provided in pulses. This is due to the ability to record the response from the applied oscillating voltage signal at a time between active plasma discharge pulses. Thereby, the response need not be isolated from the "noise" formed by the applied power used to obtain the plasma discharge (i.e. the power provided by the power supply arrangement). By recording the response from the applied oscillating voltage shortly after termination of an active plasma discharge pulse, there will still be a remaining plasma in the process chamber. In case of recording the response essentially immediately after termination of an active plasma discharge pulse, the plasma may still be existing to some degree (sometimes referred to as an "afterglow plasma").

Therefore, the method for monitoring process conditions in a plasma PVD process may suitably be performed in a pulsed plasma PVD process. This means that the power supply arrangement is configured to operate in a pulsed mode.

One example of such a process is the high-power impulse magnetron sputtering (HiPIMS) process. HiPIMS is based on magnetron sputtering, but utilizes very high power densities applied to the target in short pulses (impulses). The peak power density could typically be in the order of $kW/cm^2$ or even $MW/cm^2$ over the target surface. The peak discharge current density can reach several $A/cm^2$ over the target surface. In order to avoid overheating or other damages of the target, the pulses are applied with a low duty cycle, typically <10%. Despite the low duty cycle, the average discharge power over time can be at least essentially the same as the time-averaged discharge power in conventional magnetron sputtering. HiPIMS inter alia has the advantage of enabling a very high degree of ionization of the sputtered material. The HiPIMS process can also be conducted as a bipolar HiPIMS process, wherein the active discharge pulses are each followed by a pulse with reversed polarity to the target. When performing the method for monitoring process conditions in accordance with the present disclosure in a HiPIMS process, the step of recording the response from the applied oscillating voltage signal can easily be performed during the period between active discharge pulses.

Other examples of pulsed plasma PVD processes wherein the method for monitoring plasma process conditions according to the present disclosure may be easily used include pulsed cathodic arc deposition or pulsed DC magnetron sputtering, in particular asymmetric bipolar DC magnetron sputtering.

In a cathodic arc deposition process, an electric arc is used to vaporize material from a target. In this process, a high current, low voltage arc is used to strike the surface of the target in a so-called cathode spot. The localized temperature in the cathode spot is extremely high, which results in a high velocity jet of vaporized material from the target. The cathode spot is only active for a short period of time. The arc can be influenced by application of an electromagnetic field for the purpose of rapidly moving the arc over the surface of the target. In a pulsed cathodic arc process, the arc is provided in a pulsed mode which means that there are times during the process at which there is no active discharge arc. During said periods, the step of recording the response from the applied oscillating voltage can easily be achieved.

In pulsed DC magnetron sputtering, a pulsed DC electrical current (typically of a few hundreds of volts) is applied to the target. A pulsed magnetron sputtering arrangement can be either asymmetric bipolar pulsed or unipolar pulsed. Asymmetric bipolar pulsed is frequently used for deposition of insulating films from conductive targets through reactive sputtering, since it can still operate in conditions where the target is partially covered by insulating material. In pulsed DC operation, pulsing of the magnetron sputtering discharge is often in the frequency range of 10-250 kHz and the duty cycle is typically 50-90%.

The above described method for monitoring process conditions in a plasma PVD process may further be supplemented by an oscillating voltage signal to a probe at a substrate position in the apparatus, recording the response from said applied oscillating voltage signal, and, based on the responded response, deriving information regarding at least one plasma process condition at the substrate position. This may for example be made by applying the oscillating voltage signal to the substrate itself. Thereby, it is possible to also obtain knowledge regarding the conditions at the substrate position. Thereby, plasma process conditions may be determined at the most relevant volumes of the process chamber.

The above described method for monitoring process conditions in a plasma PVD process may naturally be further supplemented, if desired, with further techniques for determining process conditions. By way of example, a separate probe may be introduced into the apparatus at another location than described above. An oscillating voltage may be applied to said separate probe and the response recorded. Furthermore, other techniques such as a Langmuir probe, OES analysis or the like may be utilized as previously known in the art, if desired.

The present disclosure further relates to a method for controlling a plasma PVD process. The method for controlling a plasma PVD process comprises a step of performing the method for monitoring process conditions as described above, thereby deriving information regarding at least one plasma process condition. The method for controlling a plasma PVD process further comprises a step of, based on the derived information regarding at least one plasma process condition at or close to the target, adjusting an input signal to the power supply arrangement for the purpose of adjusting plasma process conditions in the apparatus. Alternatively, or additionally, the method for controlling a plasma PVD process comprises a step of, based on the derived information regarding at least one plasma process condition at or close to the target, adjusting an input signal to a gas supply device configured to introduce process gas into the process chamber and/or an input signal to a magnetic field generating device to adjust the magnetic field arrangement (in case of a tunable magnetic field) of the apparatus.

The method for controlling the plasma PVD process may suitably be performed continuously during the plasma PVD process. This also implies that the step of performing the method for monitoring plasma process conditions, as such, is performed continuously during the plasma PVD process. The term "continuously" is in this context considered to mean that it is performed repeatedly without interruption during the plasma PVD process.

FIG. 1 schematically illustrates a cross sectional side view of an exemplifying embodiment of a plasma PVD apparatus 1 in accordance with the present disclosure. The apparatus may for example be used as an industrial deposition system. The apparatus 1 according to this exemplifying embodiment may be used for high-power impulse magnetron sputtering.

The apparatus 1 comprises a process chamber 2 in the form of a vacuum chamber. The process chamber 2 may for example be essentially cylindrical, but is not limited thereto. At least one target 3 is arranged in the process chamber. The shape of the target may for example be planar rectangular, cylindrical, or hollow cylindrical, but is not limited thereto. During sputtering of the material from the target, the target 3 constitutes the cathode. The target 3 is mounted to a magnetron 4. The magnetron 4 may typically also provide the electrical connection of the target 3 to a power supply arrangement 10. The magnetron 4 may further comprise conduits for enabling cooling of the target (commonly water cooling). The magnetron 4 is arranged on the side of the target 3 which is opposite the side of the target 3 that faces the interior of the process chamber 2. The magnetron 4 generates a magnetic field (not shown) at the surface of the target 3 facing the interior of the process chamber 2. This magnetic field serves as a trap for electrons in the plasma.

The apparatus 1 further comprises an anode, which may for example be in the form of an anode ring or any other previously known configuration therefore. Alternatively, the walls of the process chamber may serve as the anode.

The apparatus further comprises a power supply arrangement 10 configured to generate plasma discharges between the target and the anode. Thereby, a plasma is generated in front of the surface of the target facing the interior of the process chamber 2. During a deposition process, ions of a process gas (such as argon) are generated in the plasma and drawn out of the plasma and accelerated across a cathode sheath. The target has a lower potential than the region in which the plasma is formed and the target surface therefore attracts ions. The positive ions move towards the target with a high velocity and then impact the target, thereby causing atoms from the target to physically dislodge or sputter from the surface.

The power supply arrangement 10 may be configured to operate in a pulsed power mode. Thereby, the power supply arrangement will generate plasma discharges during a number of consecutive pulses, each separated by a duration at which there is no active discharge. During the duration at which there is no active plasma discharge, the plasma will start to fade out until the following active discharge pulse.

The apparatus 1 may further comprise a substrate holder 6 configured to hold one or more substrates 7 onto which for example a coating is to be deposited. In the figure, three different substrates 7 are shown. The substrate holder may be stationary or rotatably arranged during the deposition process. In case of the substrate holder being rotatably arranged, it may be configured for three-fold planetary rotation or simply rotatable around a single axis of rotation. The apparatus 1 may further comprise a bias supply device 8 connected to the substrate holder 6. The bias supply device 8 may be configured to supply a bias to each of the substrates 7 during the deposition process.

The apparatus 1 further comprises a gas inlet 11. Process gas, for example argon, may be introduced via the gas inlet 11 by means of a gas supply device 12 of the apparatus. The apparatus may further comprise one or more additional gas inlets, if desired. For example, the apparatus may comprise an auxiliary gas inlet intended for introduction of a reactive gas, if desired. The apparatus further comprises an exhaust 13 configured to allow gas to be led out of the process chamber 2.

The apparatus 1 further comprises a radio frequency generator 15 configured to apply an oscillating voltage signal to the target 3. Thereby, the target may be provided with an oscillating potential. The radio frequency generator 15 is not intended to be used for the creation of plasma discharges and is therefore not to be confused with the power supply arrangement 10. The radio frequency generator 15 is intended simply for the purpose of enabling monitoring process conditions in the apparatus.

The radio frequency generator may be configured to apply an oscillating voltage having a peak-to-peak amplitude of from 10 V to 300 V. The radio frequency generator may be configured to apply the oscillating voltage signal with a frequency of from 100 kHz to 1 MHz. The apparatus 1 further comprises a radio frequency sensor 16 configured to record a response from the oscillating voltage signal applied to the target 3 by means of the radio frequency generator 15.

The apparatus 1 further comprises a control device 100 configured to control one or more of the constituent components of the apparatus 1. More specifically, the control device may be configured to control at least the radio frequency generator 15 and the radio frequency sensor 16. The control device may suitably also be configured to control the power supply arrangement 10. By way of example, the control device may be configured to control the pulse width, duty cycle, pulse frequency, and voltage as applied by the power supply arrangement to the target.

The control device 100 may comprise one or more control units. In case of the control device comprising a plurality of control units, each control unit may be configured to control a certain function or a certain function may be divided between more than one control units.

The performance of the methods as described herein may be governed by programmed instructions.

These programmed instructions typically take the form of a computer program P which, when executed in or by a control device (such as the control device 100), causes the control device to effect desired forms of action. Such instructions may typically be stored on a computer-readable medium.

It should be noted that although, the apparatus 1 as described in the exemplifying embodiment shown in FIG. 1 is intended for HiPIMS, the method for monitoring process conditions in a plasma PVD process is not limited to being performed in a HiPIMS process. It may be used in other plasma PVD processes, such as cathodic arc or pulsed DC magnetron sputtering.

Figure 2:
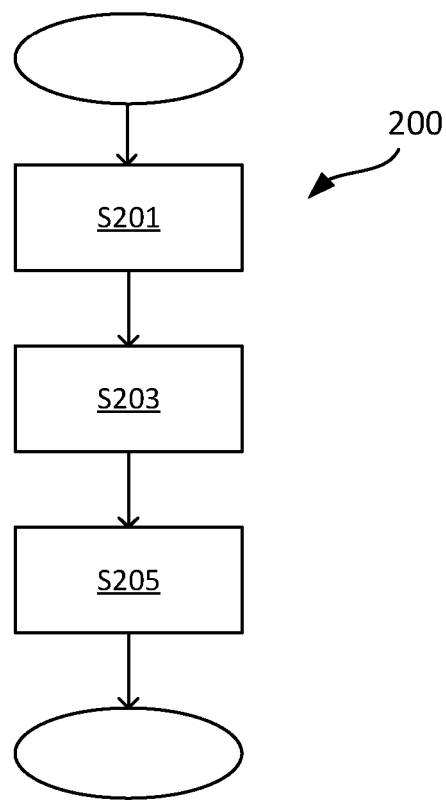
FIG. 2 represents a flowchart schematically illustrating one exemplifying embodiment of a method for monitoring process conditions in a plasma PVD process according to the present disclosure.

FIG. 2 represents a flowchart schematically illustrating an exemplifying embodiment of a method 200 for monitoring process conditions in a plasma PVD process in accordance with the present disclosure. The plasma PVD process is performed in an apparatus as previously described, for example the apparatus 1 shown in FIG. 1. The method 200 comprises a step S201 of applying an oscillating voltage signal to the target by means of a radio frequency generator. The step S201 may be performed continuously, but the method is not limited thereto. The step S201 is performed at least when there is a desire to determine process conditions, i.e. when there is a plasma present in the process chamber. In other words, step S201 is performed when a plasma has been generated by means of the power supply arrangement.

The method 200 further comprises a step S203 of recording a response from the applied oscillating voltage signal as applied by the radio frequency generator. The response is recorded by means of a radio frequency sensor.

The method 200 further comprises a step S205 of deriving information regarding at least one plasma process condition at or in the close vicinity of the target. Said information is derived based on the response as recorded by the radio frequency sensor in step S203.

Figure 3:
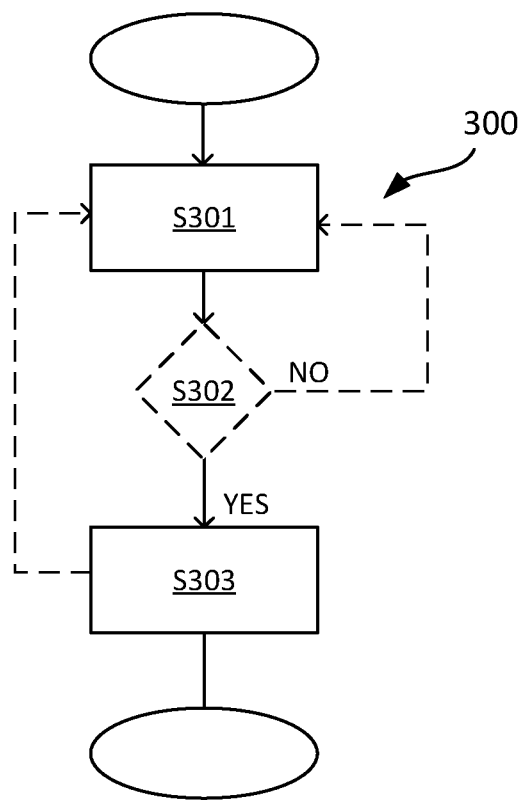
FIG. 3 represents a flowchart schematically illustrating one exemplifying embodiment of a method for control of a plasma PVD process in accordance with the present disclosure.

FIG. 3 represents a flowchart schematically illustrating an exemplifying embodiment of a method 300 for controlling a plasma PVD process in accordance with the present disclosure. The method 300 comprises a step S301 of performing the method 200 as described above with reference to FIG. 2. The method 300 may optionally further comprise a step S302 of determining whether or not there is a desire or need for adjusting input parameters to the power supply arrangement for the purpose of adjusting plasma process conditions in the apparatus. The step S302 would in such a case be performed based on the information derived in step S301. The step S302 may for example be performed by comparing the derived information regarding at least one plasma process condition with a corresponding reference range of said plasma process condition. If there is no need to adjust the input parameters to the power supply apparatus, the method may be reverted to step S301. The process further comprises a step S303 of, based on the derived information regarding at least one plasma process condition at or in the close vicinity of the target, adjusting an input signal to the power supply arrangement for the purpose of adjusting plasma process conditions in the apparatus if needed.

The method 300 may suitably be repeated for the whole duration of the plasma PVD process. Thereby, relatively stable plasma process conditions may be obtained, which for example increases the quality of the resulting product of the process. Alternatively, the method 300 may for example be performed when there is an expected need for adjusting input parameters to the power supply arrangement.

In the following, theoretical considerations for deriving information regarding at least one plasma process condition at or in the close vicinity of the target will be described. These theoretical considerations are similar to those described for example in Sezemsky et al., Modified high frequency probe approach for diagnostics of highly reactive plasma, Plasma Sources Sci. Technol. 28, 115009 (2019), but with the important difference of the target functioning as the probe instead of a separate probe inserted into the plasma.

By means of the applying an oscillating voltage signal to the target using a radio frequency generator and recording the response from the applied oscillating voltage signal, various plasma process conditions may be determined in situ. Described differently, the method provides a procedure where simultaneously measured radio frequency current and voltage characteristics may be used to characterize the plasma.

Recording the Response by Means of the RF Sensor

The first step is to carefully measure the applied RF voltage signal $U_s(t)$ and resulting RF current signal $I_s(t)$. This is carried out using an RF sensor, typically placed between the RF generator and the target. The resulting $U_s(t)$ and $I_s(t)$ waveforms may be recorded on an oscilloscope or a computer. The RF current signal can for example be measured by a current transformer and the voltage signal can for example be measured using a capacitive probe located inside the RF sensor. Details of such solutions are described by Sezemsky et al mentioned above. The RF sensor should preferably be calibrated in a wide frequency range, for example from 100 kHz to 3 MHz. The calibration can be performed using a frequency-independent resistance, resulting in voltage and current amplitude and phase correction factors. Correct measurements of the $U_s(t)$ and $I_s(t)$ waveforms may be obtained using discrete Fourier transformation (DFT) of the measured signals, where the DFT spectra are corrected with the amplitude and phase correction factors followed by inverse DFT transformation.

Ion Flux and Plasma Sheath Impedance

The above described calibrated measurements of $U_s(t)$ and $I_s(t)$ may be used to determine the relative phase $\varphi_s(t)$ between $U_s(t)$ and $I_s(t)$. Using these values, the ion flux towards the target and the plasma sheath impedance at the target can be estimated as follows.

The applied RF voltage signal to the target should have a sufficiently high amplitude (typically >10 V) to repel most of the electrons from the target surface. It is assumed that the electron contribution to the measured $I_s(t)$ in for example a typical HiPIMS process is close to zero when the amplitude of $U_s(t)$ is at least $U_s^{min} \approx -35$ V. Therefore, a peak-to-peak amplitude of at least about 70 V could advantageously be used in case of a HiPIMS process. (Here it should be noted that lower values of peak-to-peak amplitude may be possible in case of other plasma PVD processes while still achieving an electron contribution which is close to zero.) Hence, the total current measured at $U_s^{min}$ is attributed only to positive ion current to the target. The ion flux to the target surface $F_i$ is equal to $I_s(t)$ divided by the plasma-exposed target surface A at the time when the simultaneously measured $U_s(t)$ reaches its minimum, i.e. $U_s(t)=U_s^{min}$.

The plasma sheath impedance characterizes a measure of current flowing through the sheath, when there is a voltage across the sheath. Impedances measured in plasmas are commonly complex quantities because of the capacitive and inductive behavior of these discharges. Note that for a high-density plasma, which is the case in for example HiPIMS, the plasma impedance is negligible compared to the impedance of the sheath. The real and the imaginary part (reactance) ($Z_s^{Re}(t)$ and $Z_s^{Im}(t)$, respectively) of the total plasma sheath impedance $Z_{pl}(t)$ can be estimated as $$Z_s^{Re}(t) = |Z_s|(t)\cos\varphi_s(t) \qquad (1)$$

$$Z_s^{Im}(t) = |Z_s|(t)\sqrt{1-\cos^2\varphi_s(t)} \qquad (2)$$

where $$|Z_s|(t) = \frac{U_s^{pk}(t)}{I_s^{pk}(t)} \text{ and } \cos\varphi_s(t) = \frac{\frac{2}{T}\int_0^T U_s(t)I_s(t)dt}{U_s^{pk}(t)I_s^{pk}(t)}.$$

Here $U_s^{pk}(t)$ and $I_s^{pk}(t)$ denote peak values of the measured RF probe voltage and current, respectively, and T is the period of the RF probe signal.

It is important to realize that the recorded signal is not given solely by the plasma sheath impedance $Z_{pl}(t)$, but also by the impedance of the target itself and the power feed line between the target and the RF sensor unit. This background impedance has a capacitive character, resulting in a displacement current added to the recorded RF current signal $I_s(t)$. Therefore, the background impedance should be measured using the same setup, but without a plasma, and subtracted from the calculated impedance MO in order to obtain the correct plasma sheath impedance.

Electron (Plasma) Density and Electron Temperature

The same measurements of $U_s(t)$ and $I_s(t)$ can also be used to estimate the electron (plasma) density and electron temperature, again provided that the applied RF voltage signal to the target has a sufficiently high amplitude (typically >10 V). The method utilizes an approach described in detail by for example Müller et al, Towards Fast Measurement of the Electron Temperature in the SOL of ASDEX Upgrade Using Swept Langmuir Probes, Contrib. Plasma Phys. 50, 847 (2010), where high-frequency voltage sweeps were used during Langmuir probe diagnostics. In the present case, the method is based on the transformation of data measured by the RF current/voltage sensor to Langmuir-like current-voltage characteristics, where each period of the RF voltage $U_s(t)$ is considered similar to a sweeping Langmuir probe voltage with a forward and a backward part. Also here, the above-described displacement current should be subtracted from the measured current signal $I_s(t)$ to get the total current $I_{tot}(t)$. However, the total current still contains a small capacitive current due to the differential sheath capacitance, which results in a difference in $I_{tot}(t)$ depending on the voltage sweep going in the forward or backward direction. The desired Langmuir-like current $I_p(t)$ is thereby obtained by substracting the capacitive current from the total current. Details of such solutions are described by Sezemsky et al. In this way, $I_p(t)$ can be plotted as a function of $U_s(t)$ and this characteristics can be further processed in a similar manner as Langmuir probe data. For example, the electron temperature $T_e$ (in units of eV) can be determined from the first derivative of the electron current in the $I_p(t)-U_s(t)$ characteristics at the floating potential in a semi-logarithmic plot. Once the electron temperature is known, the electron (plasma) density $n_e$ can be estimated according to the Bohm criterion:

$$j_{i0} = 0.61 q_e n_e \sqrt{\frac{k_B T_e}{M_i}} \qquad (3)$$

where $j_{i0}$ is the ion current density, i.e. the recorded ion current divided by the plasma-exposed target surface A, at the floating potential, obtained by extrapolating the ion current part of the $I_p(t)$–$U_s(t)$ characteristics. Other quantities are as follows: $q_e$ the elementary charge, $M_i$ the ion mass, $k_B$ the Boltzmann constant, and $T_e$ the electron temperature in Kelvin.

To summarize the theoretical considerations above, the ion flux to the target can be obtained by the radio frequency sensor recording the amplitude of the radio frequency voltage $U_s(t)$ and the current $I_S(t)$. Furthermore, by recording the complete waveforms of $U_s(t)$ and $I_s(t)$ it is possible to obtain information also regarding plasma sheath impedance, electron temperature and electron (plasma) density.

As evident from the disclosure of the method for monitoring process conditions in a plasma PVD process in accordance with the present disclosure, the method utilizes the target as a probe instead of for example inserting a dedicated probe into the apparatus. Utilizing the target as the probe is not straight forward since the recorded response from the applied oscillating voltage, applied by means of the radio frequency generator, needs to be separated from power supplied by the power supply arrangement which is also connected to the target. This could for example be made by recording the response only when there is not active plasma discharge, for example by recording the response in the time between active discharge pulses or by a temporary short interruption of the plasma PVD process. It is however also possible to record the response during an active plasma discharge if the response can be adequately separated from the noise created by the power supply arrangement.

Figure 4:
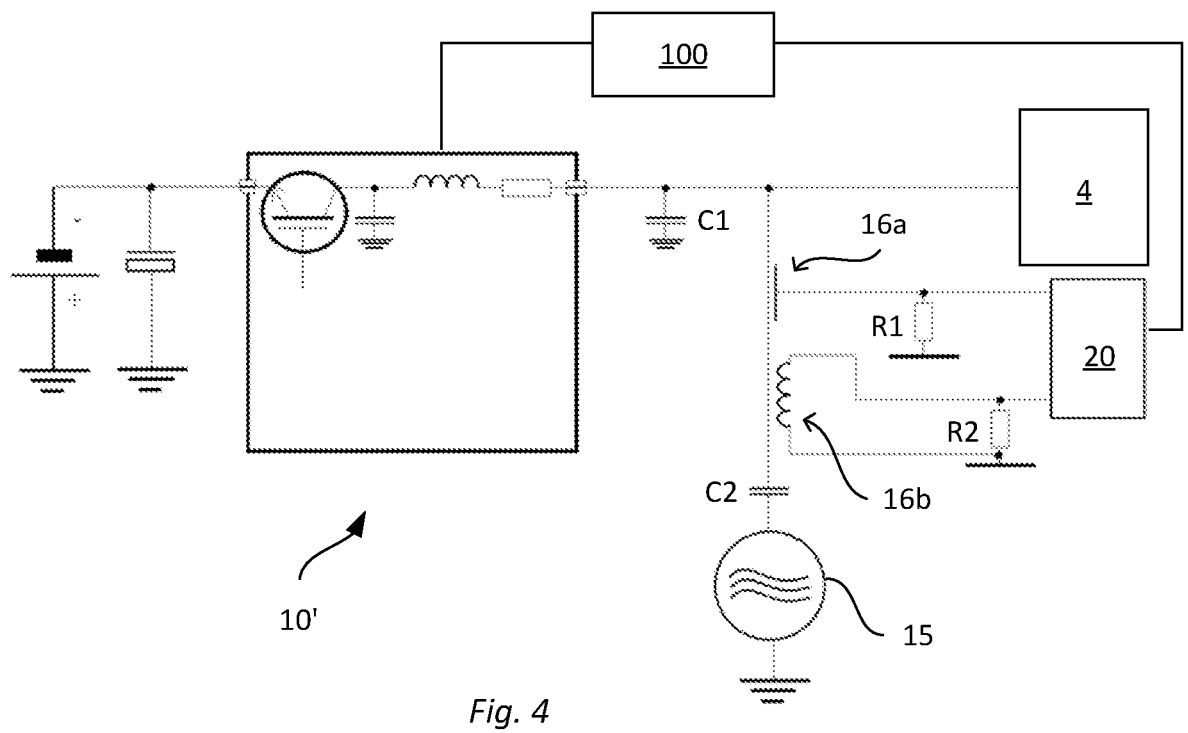
FIG. 4 schematically illustrates one example of a possible connection between a HiPIMS power supply arrangement, a magnetron, a radio frequency generator and a radio frequency sensor.

Moreover, the radio frequency generator must also be protected from the power supplied by the power supply arrangement, and it should be ensured that the power supplied by the power supply arrangement is utilized for creating the intended plasma discharge(s) instead of being lost in the radio frequency generator. This can be achieved in various ways, wherein one example thereof is illustrated in FIG. 4 for a high-power impulse magnetron sputtering apparatus. More specifically, FIG. 4 schematically illustrates one example of how the power supply arrangement, the radio frequency generator and the radio frequency sensor may be connected in a HiPIMS apparatus.

As shown in FIG. 4, a HiPIMS power supply arrangement 10' is connected to the magnetron 4. The cable connecting the HiPIMS power supply arrangement with the magnetron has a parasitic capacitance C1. The radio frequency generator 15 is connected to the magnetron 4 via a capacitor C2 in order to protect the radio frequency generator 15 from the HiPIMS power supply. The radio frequency sensor 16 (see FIG. 1) comprises a radio frequency voltage probe 16a and a current probe 16b. These probes 16a and 16b of the radio frequency sensor 16 detect the radio frequency voltage and current signals, respectively. Probe 16a comprises a first sensing resistor R1 which may be used when measuring the target voltage. Probe 16b comprises a second sensing resistor R2 over which the induced target current can be measured as a voltage drop. Signals from probes 16a and 16b of the radio frequency sensor 16 are led to for example a digital oscilloscope 20 for further processing of the data. The digital oscilloscope 20 may be connected to a control device 100. The control device 100 may further be connected to the HiPIMS power supply arrangement 10'.

Experiments

All experiments were carried out in a custom-built vacuum chamber evacuated by a turbomolecular pump to a base pressure below $10^{-4}$ Pa. The system was equipped with a Lesker Torus 2HV magnetron. Iron was sputtered from a target of 50 mm in diameter and a thickness of 1.8 mm (99.9% purity) clamped onto the magnetron. Argon (99.999% purity) was used as working gas and was held constant at a pressure of 1.0 Pa. In one experiment (Case 2 below), oxygen gas (99.995% purity) was introduced into the chamber through a mass flow controller and separate gas inlet.

The HiPIMS power supply, used in the experiments, had a configuration as described in M. Čada, Z. Hubička, P. Adámek, J. Klusoň, and L Jastrabík, Surf. Coatings Technol. 205, S317 (2011). A time-averaged discharge power of 250 W was kept constant in all experiments by varying the discharge voltage. The pulse on-time and pulse frequency were fixed at 100 µs and 100 Hz, respectively.

The experimental setup for measuring the plasma sheath impedance at the target, the ion flux towards the target as well as the electron (plasma) density and electron temperature at the target was as described above with reference to FIG. 4. The target RF voltage was provided by a Tabor Electronics 9100 high-voltage wideband amplifier with a fixed gain connected to a function generator, Agilent 33220A. The function generator was set to deliver a sinusoidal 350 kHz signal. After amplification the signal had a peak-to-peak value of (Jr 70 V on the target. The target voltage and current were monitored on an Agilent InfiniiVision DS07104B oscilloscope.

Figure 5A:
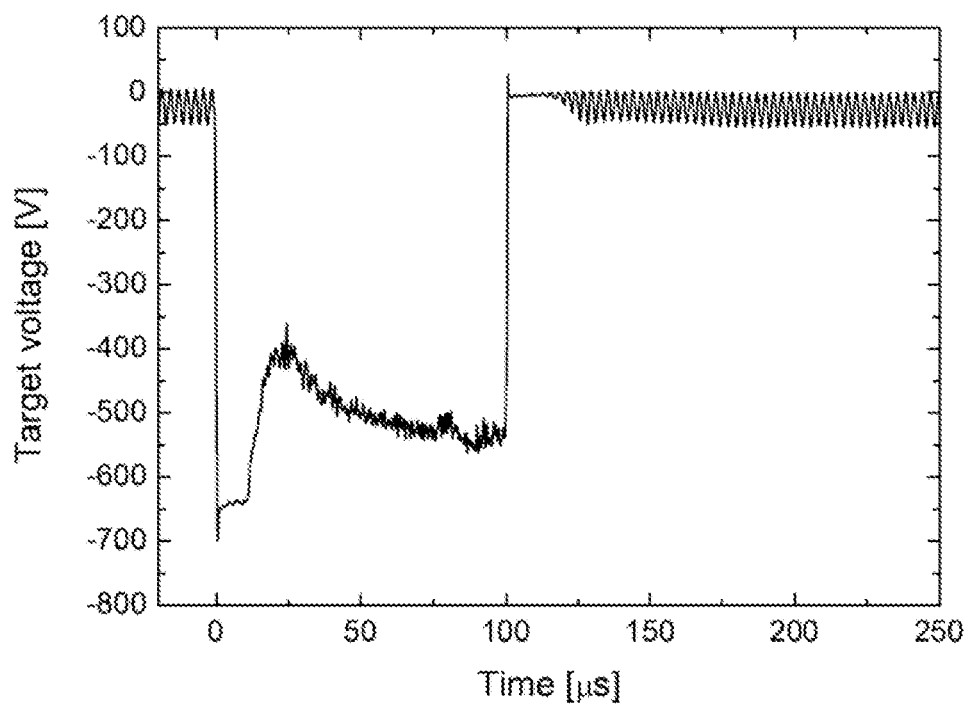
FIG. 5a shows an example of target voltage characteristics when an oscillating voltage signal is superimposed by means of a radio frequency generator in a HiPIMS process.
Figure 5B:
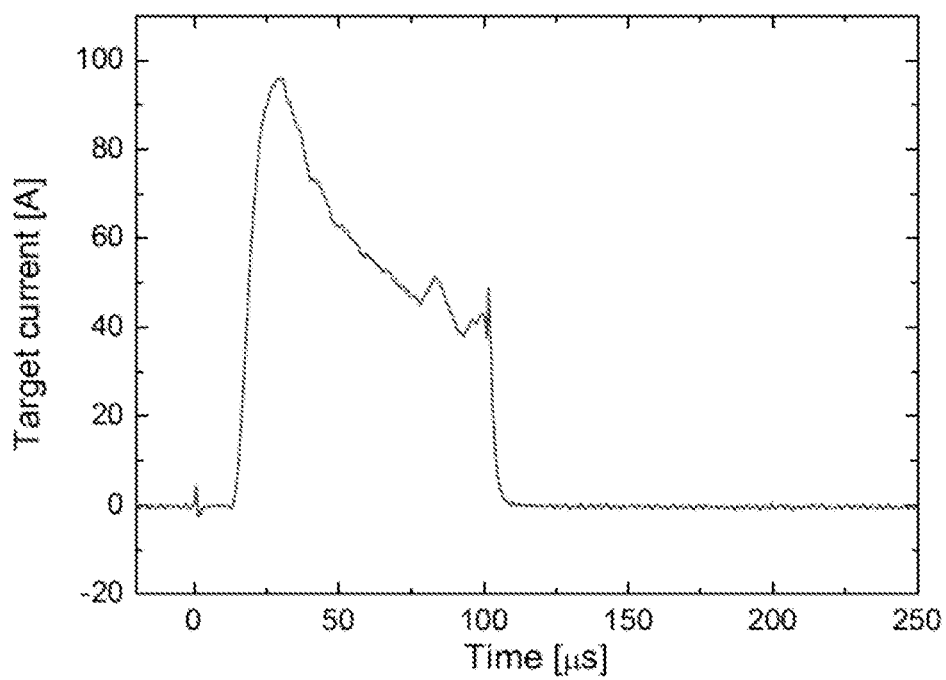

An example of the target voltage and current characteristics when superimposing the RF voltage signal in a HiPIMS process are shown in FIGS. 5a and 5b, respectively. In the FIGS. 5a and 5b, the RF voltage signal was continuously applied during the whole time, which means that it is present both during the HiPIMS discharge pulse as well as between consecutive discharge pulses without any interruption. As can be seen in FIGS. 5a and 5b, the HiPIMS discharge pulse is initiated at t=0 and ended at t=100 µs.

Results

Case 1: Non-Reactive Sputtering of Iron without Additional Oxygen

The iron target was sputtered in pure argon working gas at a flow rate of 26 sccm using the experimental setup described above, without any introduction of oxygen gas. The following plasma parameters were extracted, as described above under theoretical considerations, at the time instant t=134 µs after onset of the 100 µs-long HiPIMS discharge pulse:

Ion flux $\tau_1$ towards the target: $2.27 \cdot 10^{-3}$ A·Cm$^{-2}$
Plasma sheath impedance at the target: ReZ=229Ω, ImZ=212 Ω
Electron temperature: 4.45 eV
Electron density: $1.28 \cdot 10^{16}$ m$^{-3}$ Case 2: Reactive Sputtering of Iron with Oxygen The iron target was sputtered in a working gas mixture of argon (flow rate 26 sccm) and oxygen (flow rate 2 sccm) using the experimental setup described above. The following plasma parameters were extracted, as described above under theoretical considerations, at the time instant t=134 µs after onset of the 100 µs-long HiPIMS discharge pulse:

Ion flux $F_1$ towards the target: $4.47 \cdot 10^{-3}$ A·cm$^{-2}$
Plasma sheath impedance at the target: ReZ=188Ω, ImZ=256 Ω
Electron temperature: 3.3 eV
Electron density: $2.96 \cdot 10^{16}$ m$^{-3}$

DISCUSSION

From the experimental results presented above we here discuss some of the observed differences and similarities between the two investigated cases.

The total ion flux consists of ionized working gas as well as ionized sputtered material. Together they result in an ion flux to the target of a few mA·cm$^{-2}$ in the plasma afterglow (t=134 µs, i.e., 34 is after the HiPIMS discharge pulse). This is in good agreement with ion flux measurements at a typical substrate position by D. Lundin et al., Time-resolved ion flux and impedance measurements for process characterization in reactive high-power impulse magnetron sputtering, Journal of Vacuum Science & Technology A 34, 041305 (2016) at approximately the same time-instant. It is in above described experimental results found that the ion flux in the reactive case is almost twice the ion flux in the non-reactive (pure argon) case, which also correlates well with the measured electron density exhibiting the same trend. The results on ion flux and the electron density are correlated with the discharge current density, which was higher at the end of the HiPIMS pulse when adding oxygen to the working gas.

Measured electron temperatures are in the range of a few eV, which is well in agreement with probe measurements by Sezemsky et al., Modified high frequency probe approach for diagnostics of highly reactive plasma, Plasma Sources Sci. Technol. 28, 115009 (2019), who used the same analysis method as described in the theoretical considerations.

It is difficult to make any direct comparisons of the plasma sheath impedance at the target, due to the lack of data in the literature. However, plasma sheath impedance measurements at a typical substrate position by D. Lundin et al., Time-resolved ion flux and impedance measurements for process characterization in reactive high-power impulse magnetron sputtering, Journal of Vacuum Science & Technology A 34, 041305 (2016) show that ImZ (reactance) is about a factor eight higher compared to the target values reported here at approximately the same time-instant. The higher reactance at the substrate position is likely related to the lower remnant plasma density at the substrate position compared to the denser plasma region in the vicinity of the target.

Radio Frequency Power

For the purpose of illustrating the difference between the power generated as a result of application of an oscillating voltage signal to the target by means of a radio frequency generator and the power generated by the power supply arrangement during the conduct of the method according to the present disclosure, a test was performed essentially in accordance with the above-described experimental results with the exception that the applied oscillating voltage signal had a peak-to-peak value of $U_s^{Pk} \approx -60$ V on the target.

Figure 6A:
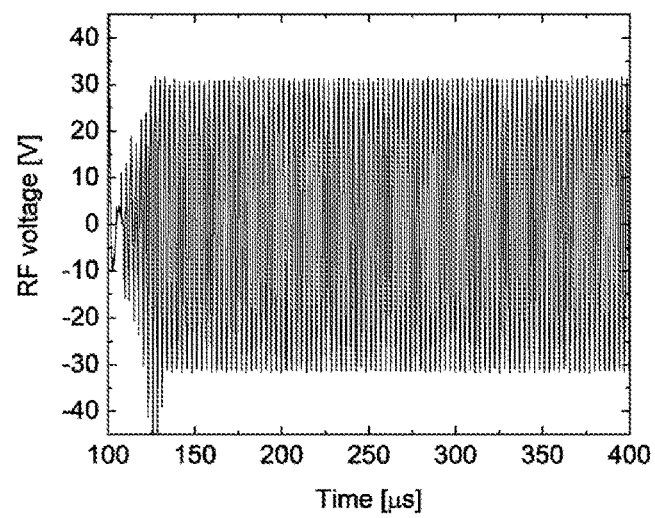
FIG. 6a shows an example of target voltage over time, after an HiPIMS pulse, when an oscillating voltage signal is applied to a target.
Figure 6B:
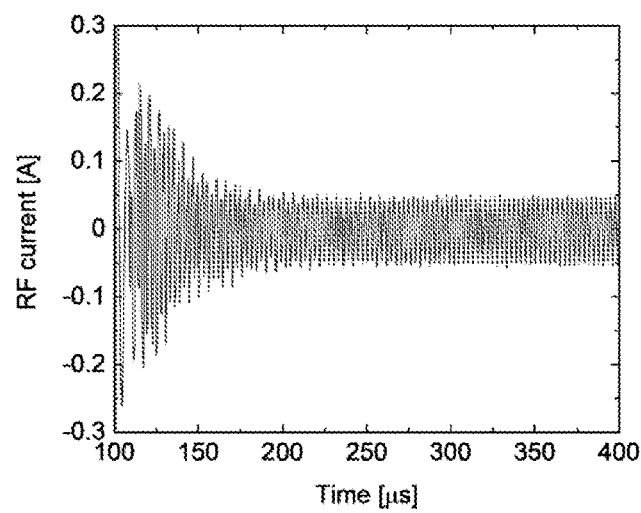
FIG. 6b shows an example of target current over time, after an HiPIMS pulse, when an oscillating voltage signal is applied to a target.
Figure 6C:
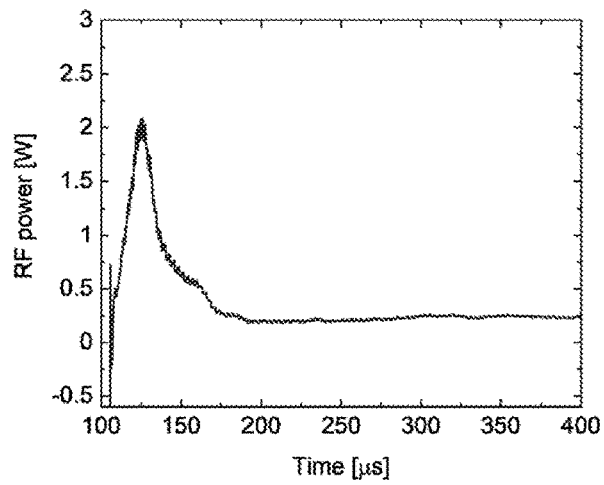
FIG. 6c shows an example of target power over time, after an HiPIMS pulse, when an oscillating voltage signal is applied to a target.

FIG. 6a illustrates the target voltage over time, and FIG. 6b illustrates the target current over time. FIG. 6c illustrates the target power over time. In all of FIGS. 6a-6c, the HIPIMS pulse was ended at t=100 µs.

As can be seen in FIG. 6a, the applied oscillating voltage becomes evident a few microseconds after the HiPIMS pulse has ended. As seen in FIG. 6c, the power at the target firstly increases as a result of the increased amplitude of the oscillating voltage. Furthermore, the maximum power of the target resulting from the application of the oscillating voltage signal by means of the radio frequency generator is 2 W and occurred at about t=130 µs. Thereafter, the power is reduced and after about t=180 µs (when the plasma discharge has faded out) the power is fairly constant at about 0.3 W. This is a result of the amplitude of the current decreasing, although the amplitude of the applied oscillating voltage is essentially constant. The power shown in FIG. 6c may be compared with the time-averaged discharge power of 250 W of the HiPIMS power supply arrangement.

The invention claimed is:

1. A method for monitoring process conditions in a plasma PVD process, the plasma PVD process performed in an apparatus comprising:
   a process chamber,
   a target arranged inside the process chamber,
   a power supply arrangement connected to the target and configured to generate plasma discharges,
   a radio frequency generator, and
   a radio frequency sensor;
the method comprising the steps of:
   when a plasma has been generated by means of the power supply arrangement, applying an oscillating voltage signal to the target by means of the radio frequency generator;
   recording a response from the applied oscillating voltage signal by means of the radio frequency sensor; and
   based on the recorded response, deriving information regarding at least one plasma process condition at the target,
wherein the step of recording a response from the applied oscillating voltage signal comprises recording a response current amplitude and a current phase shift, and
wherein the oscillating voltage signal is applied with a frequency of from 100 kHz to 1 MHz.

2. The method according to claim 1, wherein a peak-to-peak amplitude of the applied oscillating voltage signal is from 10 V to 300 V.

3. The method according to claim 1, wherein the power supply arrangement is configured to operate in a pulsed mode, and
   wherein the step of deriving information regarding at least one plasma process condition is performed based on a response recorded in between two active plasma discharge pulses as applied by the power supply arrangement.

4. The method according to claim 1, wherein the plasma PVD process is high-power impulse magnetron sputtering (HiPIMS).

5. The method according to claim 1, the method further comprising:
   during operation of the plasma PVD process, applying a second oscillating voltage signal to a probe arranged at a substrate position in the apparatus,
   recording a response from the second applied oscillating voltage signal, and
   based on the recorded response from the second applied oscillating voltage, deriving information regarding at least one plasma process condition at the substrate position.

6. A method for controlling a plasma PVD process performed in an apparatus, the apparatus comprising:
   a process chamber,
   a target arranged inside the process chamber,
   a power supply arrangement connected to the target and configured to generate plasma discharges,
   a radio frequency generator, and
   a radio frequency sensor;
the method for controlling a plasma PVD process comprising the steps of:
   performing the method for monitoring process conditions according to claim 1; and
   based on the derived information regarding at least one plasma process condition at the target, adjusting an input signal to the power supply arrangement and/or an input signal to a gas supply device configured to introduce process gas into the process chamber, thereby adjusting plasma process conditions in the apparatus.

7. The method according to claim 6, wherein the method for controlling the plasma PVD process is performed continuously during the plasma PVD process.

8. The method according to claim 6, wherein the plasma PVD process is high-power impulse magnetron sputtering (HiPIMS).

9. A computer program comprising instructions which, when executed by a control device, cause the control device to carry out the method according to claim 1.

10. A computer-readable medium comprising instructions which, when executed by a control device, cause the control device to carry out the method according to claim 1.

11. A plasma PVD process apparatus, comprising:
   a process chamber configured to comprise a target;
   a power supply arrangement configured to be connected to the target and configured to provide plasma discharges;
   a radio frequency generator configured to apply an oscillating voltage to the target when a plasma has been generated by means of the power supply arrangement;
   a radio frequency sensor configured to record a response from the applied oscillating voltage signal to the target; and
   a control device configured to derive information regarding at least one plasma process condition at the target based on the response recorded by the radio frequency sensor,
wherein the response recorded by the radio frequency sensor comprises a response current amplitude and a current phase shift, and
wherein the oscillating voltage is applied with a frequency of from 100 kHz to 1 MHz.

12. The plasma PVD process apparatus according to claim 11, wherein the power supply arrangement is configured to be operated in a pulsed mode, and
   wherein the control device is configured to derive information regarding the at least one plasma process condition based on the response recorded by the radio frequency sensor between plasma discharge pulses applied by the power supply arrangement.

13. The plasma PVD process apparatus according to claim 11, wherein the control device is further configured to adjust an input signal to the power supply arrangement, and/or an input signal to a gas supply device configured to introduce process gas into the process chamber, based on the derived information regarding at least one plasma process condition at er close to the target for the purpose of adjusting plasma process conditions in-situ.

14. The plasma PVD process apparatus according to claim 11, wherein the apparatus is a high-power impulse magnetron sputtering (HiPIMS) apparatus.

15. A method for monitoring process conditions in a plasma PVD process, the plasma PVD process performed in an apparatus comprising:
   a process chamber,
   a target arranged inside the process chamber,
   a power supply arrangement connected to the target and configured to generate plasma discharges,
   a radio frequency generator, and
   a radio frequency sensor;
the method comprising the steps of:
   when a plasma has been generated by means of the power supply arrangement, applying an oscillating voltage signal to the target by means of the radio frequency generator;
   recording a response from the applied oscillating voltage signal by means of the radio frequency sensor; and
   based on the recorded response, deriving information regarding at least one plasma process condition in a vicinity of the target,
wherein the step of recording a response from the applied oscillating voltage signal comprises recording a response current amplitude and a current phase shift, and
wherein the oscillating voltage signal is applied with a frequency of from 100 kHz to 1 MHz.

16. A method for controlling a plasma PVD process performed in an apparatus, the apparatus comprising:
   a process chamber,
   a target arranged inside the process chamber,
   a power supply arrangement connected to the target and configured to generate plasma discharges,
   a radio frequency generator, and
   a radio frequency sensor;
the method for controlling a plasma PVD process comprising the steps of:
   performing the method for monitoring process conditions according to claim 15; and
   based on the derived information regarding at least one plasma process condition in the vicinity of the target, adjusting an input signal to the power supply arrangement and/or an input signal to a gas supply device configured to introduce process gas into the process chamber, thereby adjusting plasma process conditions in the apparatus.

17. The method according to claim 16, wherein the plasma PVD process is high-power impulse magnetron sputtering (HiPIMS).

18. The method according to claim 15, wherein the at least one plasma process condition is an ion flux, a plasma sheath impedance, an electron temperature, or an electron density.

19. A computer program comprising instructions which, when executed by a control device, cause the control device to carry out the method according to claim 15.

20. The method according to claim 1, wherein the at least one plasma process condition is an ion flux, a plasma sheath impedance, an electron temperature, or an electron density.

* * * * *